(12) United States Patent
Lu et al.

(10) Patent No.: US 7,573,587 B1
(45) Date of Patent: Aug. 11, 2009

(54) METHOD AND DEVICE FOR CONTINUOUSLY MEASURING SILICON ISLAND ELEVATION

(75) Inventors: Zheng Lu, O'Fallon, MO (US); Steven L. Kimbel, St. Charles, MO (US); Robert H. Fuerhoff, St. Charles, MO (US); Joseph C. Holzer, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 12/197,669

(22) Filed: Aug. 25, 2008

(51) Int. Cl.
*G01B 11/14* (2006.01)
*G01B 11/22* (2006.01)
(52) U.S. Cl. .................................................. 356/634
(58) Field of Classification Search .......... 356/600–640
See application file for complete search history.

(56) References Cited

U.S. PATENT DOCUMENTS

| | | | |
|---|---|---|---|
| 2,747,971 A * | 5/1956 | Hein | 117/41 |
| 3,740,563 A | 6/1973 | Reichard | |
| 4,926,357 A * | 5/1990 | Katsuoka et al. | 702/157 |
| 5,588,993 A * | 12/1996 | Holder | 117/13 |
| 5,790,241 A | 8/1998 | Trussell, Jr. | |
| 5,846,318 A * | 12/1998 | Javidi | 117/14 |
| 6,077,345 A * | 6/2000 | Easoz et al. | 117/14 |
| 6,106,612 A * | 8/2000 | White | 117/14 |
| 6,454,851 B1 * | 9/2002 | Fuerhoff et al. | 117/15 |

* cited by examiner

*Primary Examiner*—Gregory J Toatley, Jr.
*Assistant Examiner*—Jarreas C Underwood
(74) *Attorney, Agent, or Firm*—Senniger Powers LLP (57) ABSTRACT

A method of continuously measuring an elevation and shape of an unmelted polycrystalline silicon island during a silicon meltdown process. The method comprises projecting a focused bright light on the silicon island to produce a bright dot on the silicon island. The method also includes electronically determining an elevation and a shape of the silicon island by tracking the bright dot during the meltdown process.

13 Claims, 7 Drawing Sheets

METHOD AND DEVICE FOR CONTINUOUSLY MEASURING SILICON ISLAND ELEVATION

BACKGROUND OF THE INVENTION

The present invention generally relates to a system and method for measuring and monitoring the elevation and shape of a silicon island during charge meltdown, granular silicon feeding in a crystal grower used to grow mono-crystalline silicon ingots.

The elevation and shape of the silicon island is critical to the quality of the silicon meltdown process which is in turn essential to the success of crystal growth from the silicon melt. The elevation and shape are affected by many variables in the meltdown process such as heater powers, granular poly feed rates, feeding locations, crucible positions, etc. To better ensure that the crystal growth is performed under optimal conditions, the silicon island should be measured and continuously monitored throughout the meltdown process. This can be difficult because the elevation of the silicon island is constantly changing and the shape of the island is also constantly changing and has very complex variations.

One existing method of measuring and monitoring a silicon island includes using a photo multiplier tube or charge-coupled device (CCD) cameras with a conventional light source (i.e., standard LEDs or the background radiation in the grower). This particular method, however, is not accurate enough to satisfy the control needs and is not capable of monitoring the silicon island in all meltdown conditions. Another method includes the use of a laser range finder or similar device. However, this method is not suitable for use in a crystal growth furnace because the laser beam generates reflection or scattering signals from the windows and heat shield on the furnace, causing significant errors in range finder measurements.

Thus, there exists a need for an effective means of continuously measuring and monitoring the silicon island during the meltdown process regardless of the conditions inside or outside of the crystal growth furnace. Furthermore, such means should not affect the meltdown or crystal growth process or pose harm to the operators.

SUMMARY OF THE INVENTION

In one aspect, the present invention includes a method of continuously measuring an elevation and a shape of an unmelted polycrystalline silicon island during a silicon meltdown process. The method comprises projecting a focused bright light on the silicon island to produce a bright dot on the silicon island. Further, an elevation and a shape of the silicon island are electronically determining by tracking the bright dot during the meltdown process.

In another aspect, the present invention includes a system for use in combination with apparatus for growing a silicon crystal from a silicon melt to measure an elevation and a shape of an unmelted polycrystalline silicon island of the silicon melt during a silicon meltdown process. The apparatus includes a housing having an interior in which the silicon melts. The system measures an elevation and a shape of an unmelted polycrystalline silicon island. The system comprises a focused bright light source directed into the interior of the housing for projecting a bright dot onto the silicon island. Further, the system includes a camera directed into the interior of the housing for generating a continuous image pattern of a portion of the silicon island including the bright dot. In addition, the system includes a programmable controller remote from the housing for determining a location and an elevation of the bright dot and continuously calculating a shape and an elevation of the silicon island therefrom based on the image pattern.

Other objects and features will be in part apparent and in part pointed out hereinafter.

BRIEF DESCRIPTION OF THE DRAWINGS

Corresponding reference characters indicate corresponding parts throughout the drawings.

DESCRIPTION OF THE PREFERRED EMBODIMENTS

Figure 1:
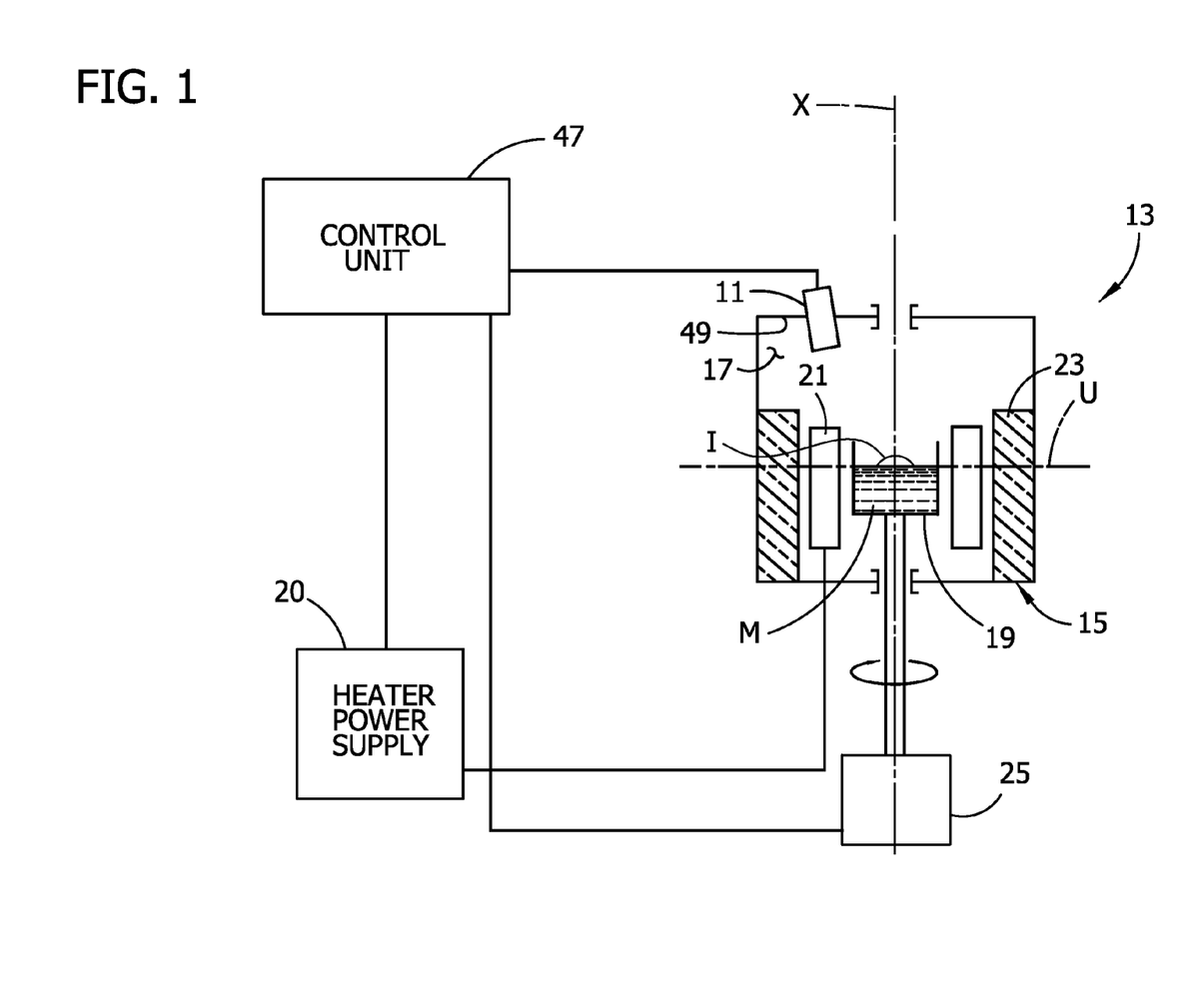
FIG. 1 is a schematic illustration of a crystal grower including apparatus of the present invention for preparing a molten silicon melt from polycrystalline silicon.

Now referring to the drawings, and in particular to FIG. 1, an apparatus of the present invention, generally indicated at 11, is illustrated for use with a crystal grower, generally indicated at 13, of the type used to grow mono-crystalline silicon ingots by a Czochralski method. The crystal grower 13 includes a housing, generally indicated at 15, for isolating an interior including a crystal growth chamber 17. A quartz crucible 19 is supported in the growth chamber 17 and contains molten semiconductor source material M from which the mono-crystalline silicon ingot is grown. A heater power supply 20 energizes a resistance heater 21 surrounding the crucible 19 to form the molten silicon M in the crucible. Insulation 23 lines the inner wall of the housing 15. A crucible drive unit 25 rotates the crucible 19 about a vertical axis X, as indicated by the arrow, and raises and lowers the crucible during the growth process.

Figure 2:
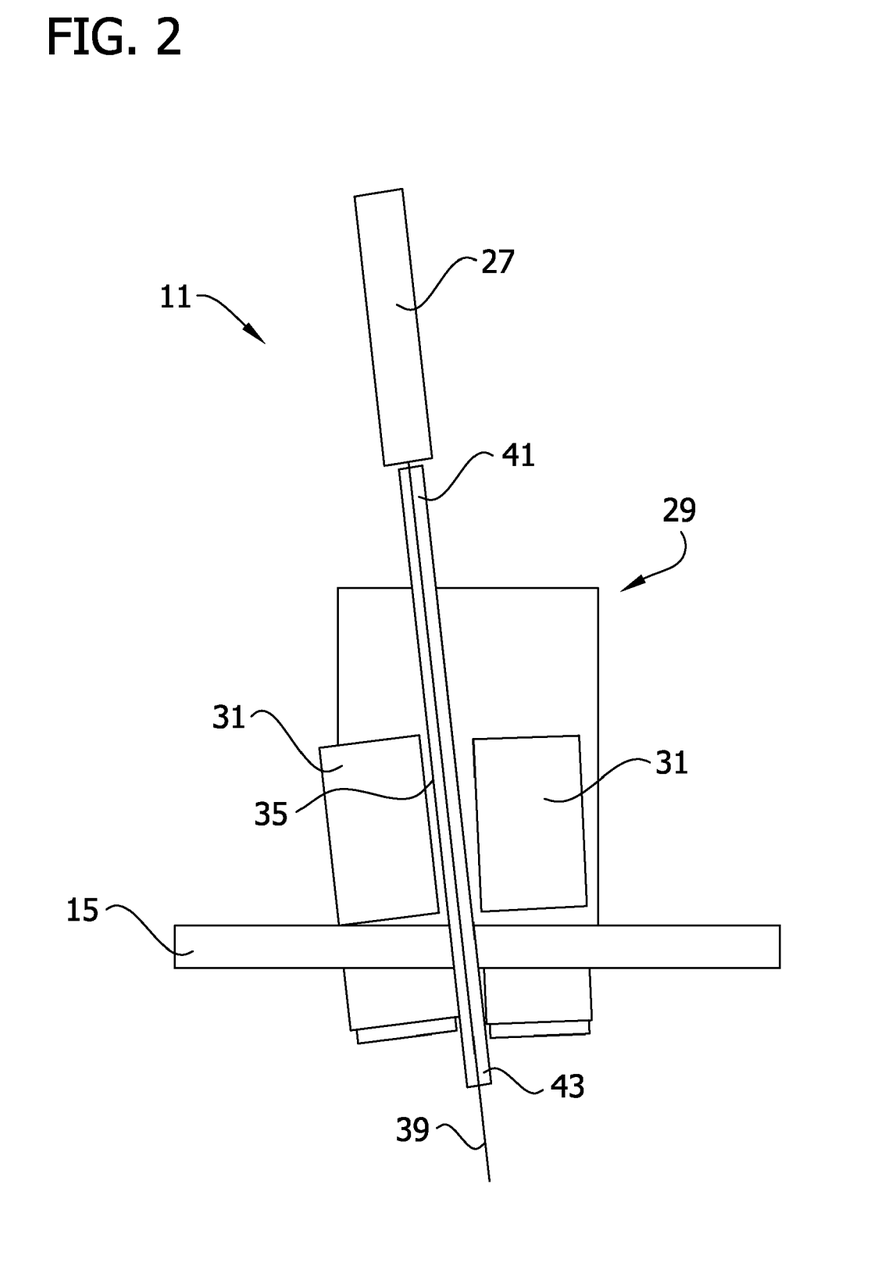
FIG. 2 is a side view of a camera and a laser source of the apparatus

As illustrated in FIG. 2, the apparatus 11 comprises a laser or focused bright light source 27, and a camera system, generally indicated at 29. The camera system includes a camera 31 and detection and tracking software. The focused light source 27 is mounted on the housing 15 of the crystal grower 13. The light source 27 comprises a short wavelength laser (such as a green/blue laser) or a focused ultra-bright light source (high powered green/blue LEDs). A green laser (e.g. about 532 nm), blue diode laser or high power blue LED (e.g. about 405 nm) is used to avoid a cut-off wavelength of a typical heat shield window/filter on a crystal grower. Generally, the cut-off wavelength is from about 600 nm to about 650 nm for a shield window/filter. Because these light sources have wavelengths below the cut-off wavelength, they will achieve a high transmission and high signal to noise ratio through a protective window 33 and into the crystal grower 13, which has a strong ambient radiation. It is understood that alternative light sources could be used without departing from the scope of the invention. For instance, an LED having a wavelength less than the cut-off wavelength of the window 33 (e.g., less than about 600 nm) can also be used provided the LED is sufficiently bright. In the preferred embodiment, the requirement for the optical output of the focused light source 27 is typically greater than about 10 mW. However, light sources having optical outputs of 10 mW or less are also within the scope of the invention.

Figure 5:
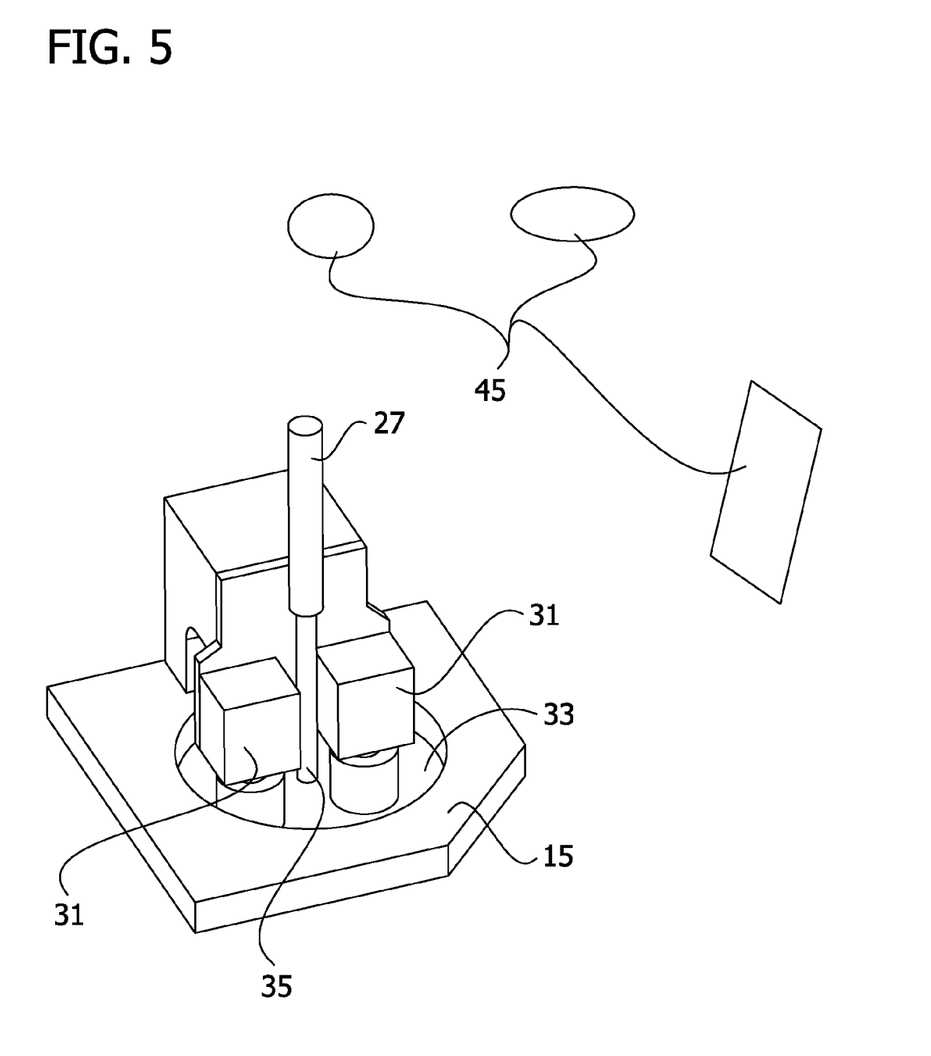
FIG. 5 is a partial perspective of the apparatus and the crystal grower including a schematic of optical shields of the present invention.

Referring to FIG. 2, the laser 27 also includes a protection shield 35. The protection shield is attached to the camera 31 and mounted on a camera window 37. The shield 35 consists of an elongate tube open at both ends for receiving the laser beam 39 at a first end 41 and permitting the beam to exit at a second end 43, opposite the first end. The side walls of the tube are made of a suitable material for preventing any misdirected or reflected laser beams from being projected to the surrounding environment. To protect operators from laser radiation, optical shields 45 with corresponding wavelengths can also be installed on all the observation and auxiliary windows as shown in FIG. 5. Those skilled in the art will be familiar with suitable protection and optical shields for use in the present invention.

The two-dimensional camera 31 is also mounted on the housing 15 of the crystal grower 13 and is in electrical communication with a control unit 47 (see FIG. 1). The camera 31 is represented as a box to indicate that one or more than one camera may be used without departing from the scope of the present invention. As is well known in the art, the control unit 47 is electrically connected to various operating components of the crystal grower 13 to control operation of the grower. The camera 31 is mounted in a viewport 49 of the crystal grower housing 15 and is aimed generally at an intersection of the central axis X of the grower and an upper surface U of the molten silicon M in the crucible 19.

For example, the camera 31 may be mounted at an angle from about 15° to about 34° measured with respect to the central axis X of the crystal grower 13. The camera 31 is preferably a monochrome charge coupled device (CCD) camera, such as Sony XC-75 CCD video camera having a resolution of 768×494 pixels.

Additionally, depending on the type of light source 27 used, a corresponding laser line interference filter (laser) or band pass filter (LED) can be used on the detection CCD camera 31 so the camera selects dot signals that are not affected by most of the ambient radiation in the crystal grower 13. The type of filters suitable for use in the present invention will be known to those skilled in the art.

Figure 3:
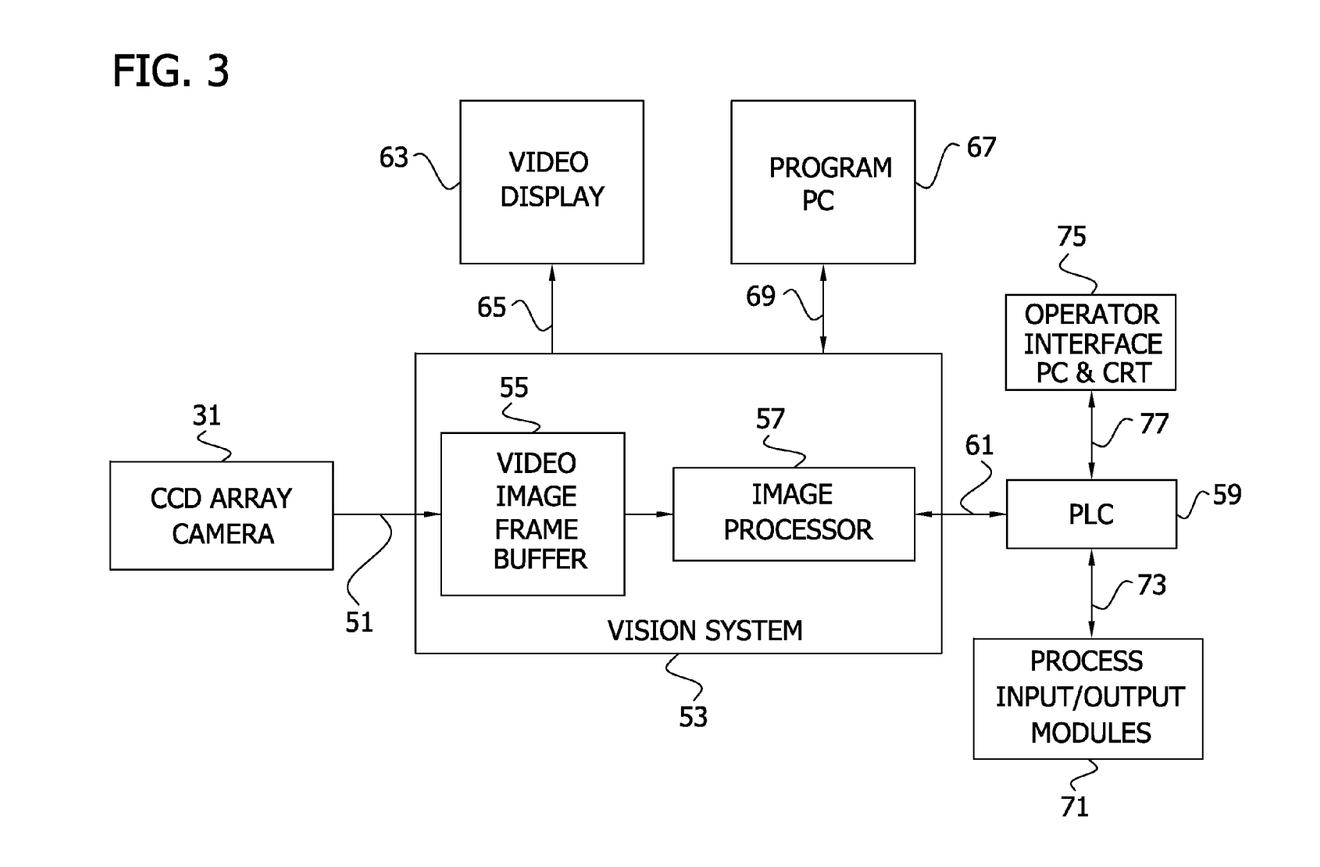
FIG. 3 is a block diagram of a control unit and camera of the apparatus of FIG. 1.
Figure 4:
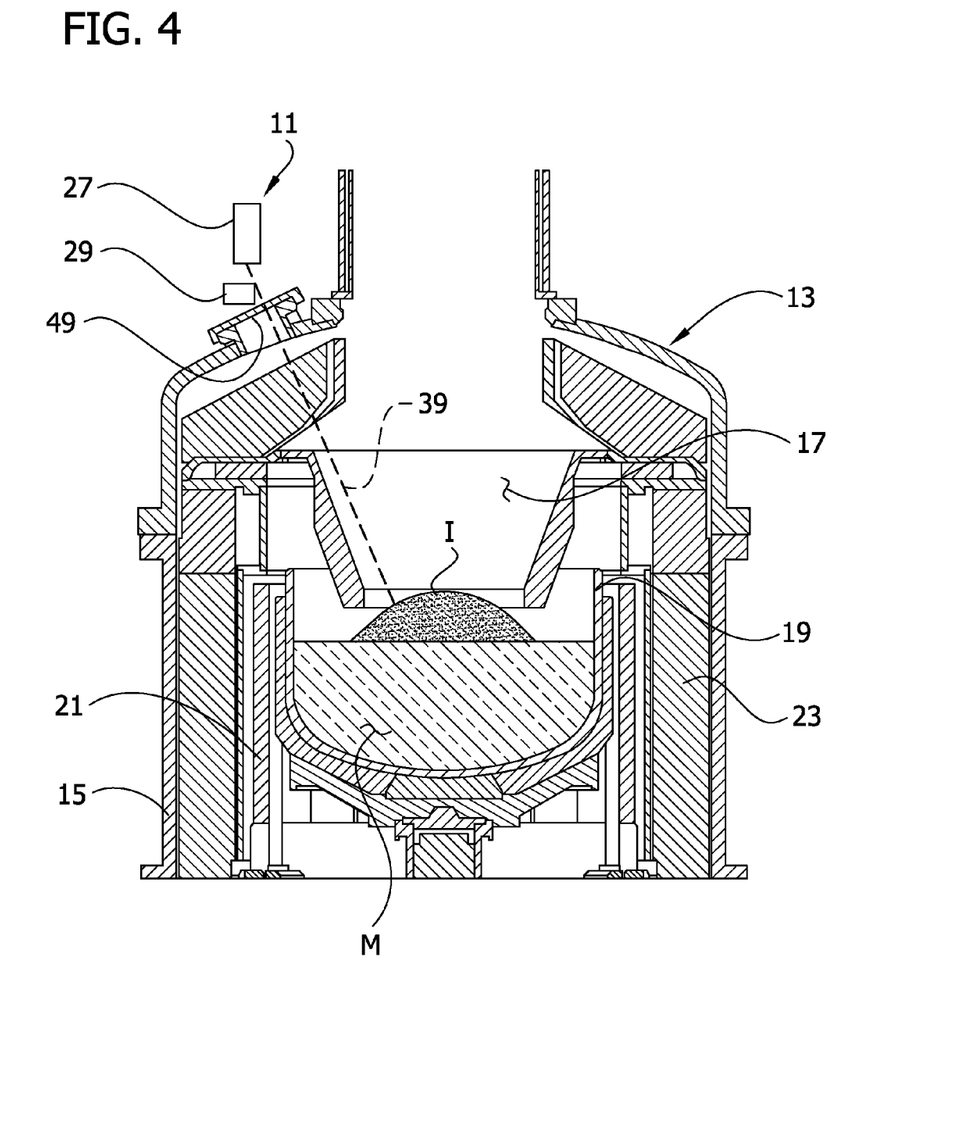
FIG. 4 is a fragmentary section view of the crystal grower including a schematic of the apparatus of the present invention.

FIG. 3 illustrates a preferred embodiment of the control unit 47 in block diagram form. The camera 31 communicates video images via line 51 (e.g., an RS-170 video cable) to a vision system 53. The vision system includes a video image frame buffer 55 and an image processor 57 for capturing and processing the video images. As an example, the vision system 53 is a Cx-100 Imagenation Frame grabber or a Cognex CVS-4400 vision system. In turn, the vision system 53 communicates with a programmable logic controller (PLC) 59 via line 61. In one preferred embodiment, the PLC 59 is a Model 575 PLC or a Model 545 PLC manufactured by Texas Instruments and line 61 is a communication interface (e.g., VME backplane interface).

The vision system 53 also communicates with a video display 63 via line 65 (e.g., an RS-170 RGB video cable) for displaying the video image generated by the camera 31 and with a computer 67 via line 69 (e.g., an RS-232 cable) used to program the vision system. As illustrated in FIG. 2, the PLC 59 communicates with one or more process input/output modules 71 via line 73 (e.g., an RS-485 cable). An operator interface computer 75 also communicates with the PLC via line 77 (e.g., an RS-232 cable) to permit the crystal puller operator to input desired operating parameters to the PLC and/or to retrieve operating information from the PLC during operation of the crystal grower 13.

The detection and tracking software detects and tracks the location of a bright dot produced by the beam 39 of the light source 27 on the silicon melt M. The software continuously calculates the actual location and elevation of the dot. From theses calculations, the software can continuously measure and monitor the elevation and shape of the silicon island I. The computer 67 is programmable such that it can access and execute the detection and tracking software. Software of the type described above is commonly known to those skilled in the art. Therefore, no further explanation is needed.

Figure 6:
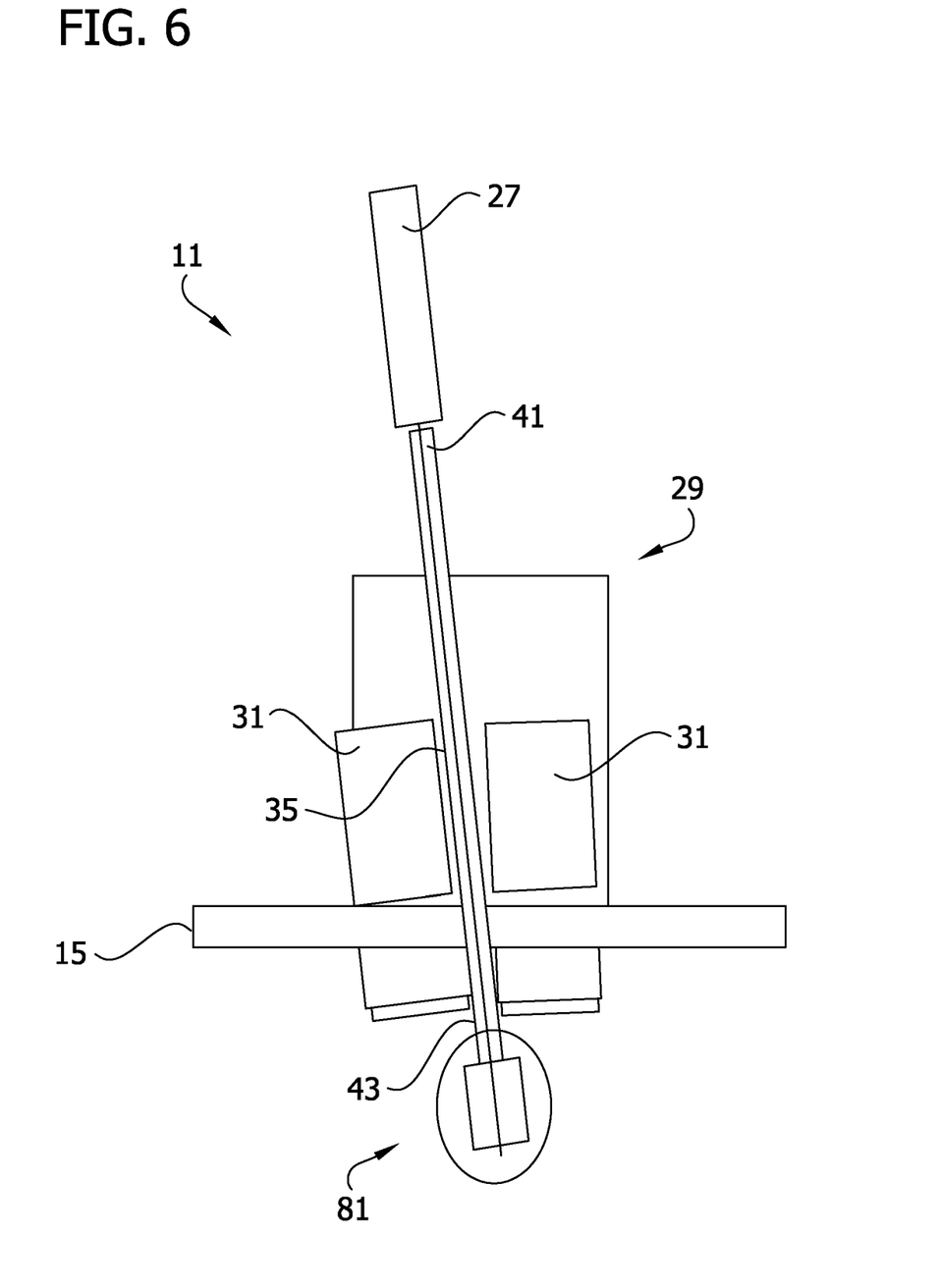
FIG. 6 is an illustration of a second embodiment of the present invention illustrating a side view of the camera and laser source of the apparatus and a schematic of an elevation control scanner.
Figure 7:
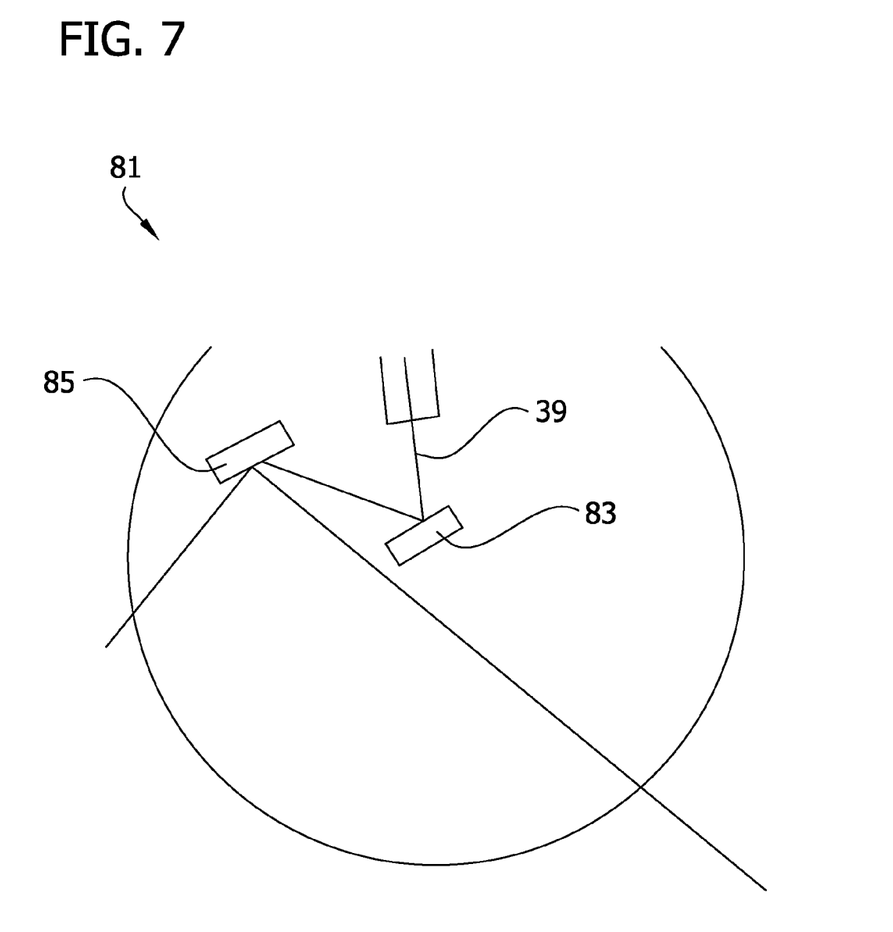
FIG. 7 is an expanded view of the scanner of FIG. 6.

In a second embodiment, the apparatus 11 includes an elevation control scanner 81 attached to the end of the laser shield 35 and arranged to scan in one or more directions to provide real time 3D measurements of the silicon island I (see FIGS. 6 and 7). A first mirror 83 reflects the beam 39 from the light source 27 to a second mirror 85 having a piezoelectric motion drive (not shown) on its back configured to reflect the beam 39 along a radius of the island I. The beam 39 can be arranged to scan along the island radius at a predetermined speed or controlled by the camera PC 67.

In operation, the light source 27 of the apparatus 11 projects a bright green or blue laser dot, clearly visible in the ambient radiation of the crystal grower chamber 13, at a desired location on the silicon island I. Typically, this location is where the elevation is most representative of the changing silicon island I and it is determined based on a slope of a surface of the silicon island. Preselecting the laser dot location allows the operator to optimize tracking and controlling quality of the silicon island I.

The detection and tracking software detects and tracks the dot and continuously calculates a location and an elevation of the dot. Because the silicon island I moves rotationally and vertically during the meltdown process, the dot accurately correlates with the elevation and shape of the moving silicon island at a certain time and location. Through this continuous detecting, tracking and calculating process, the elevation and shape of the silicon island I at desirable locations are measured, monitored and controlled.

In the alternative embodiment, the dot can be scanned by the elevation control scanner 81 in one or more dimensions to provide 3D measurements of the silicon island I. Since the island I is rotating at a predetermined rotation rate during meltdown, the continuous tracking of the scanning laser dot on the island radius provides real time 3D shape measurements. This can be very helpful to provide more dynamic meltdown control.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method of continuously measuring an elevation and a shape of an unmelted polycrystalline silicon island during a silicon meltdown process, the method comprising:
   projecting a focused bright light on the silicon island to produce a bright dot on the silicon island; and
   electronically determining an elevation and a shape of the silicon island by tracking the bright dot during the meltdown process.

2. The method of claim 1 wherein said determining step comprises:
   capturing and processing a video image of the bright dot on the silicon island during the meltdown process;
   electronically determining the location and the elevation of the dot on the silicon island continuously during the meltdown process; and
   calculating the elevation and the shape of the silicon island based on the location and the elevation of the dot in response to the movement of the silicon island.

3. The method of claim 2 wherein said steps of electronically determining the location and the elevation of the bright dot and electronically calculating the elevation and the shape of the silicon island are accomplished by computer software.

4. The method of claim 1 wherein said step of electronically determining the elevation and the shape of the silicon island comprises scanning the bright dot with a piezoelectric controlled mirror in a direction to provide 3D measurements of the silicon island.

5. The method of claim 2 wherein said step of capturing and processing the video image of the bright dot on the silicon island further comprises filtering the video image.

6. The method of claim 1 wherein the shape of the island during the meltdown process is controlled by projecting the bright light on the silicon island based on a slope of the island.

7. A system for use in combination with an apparatus for growing a silicon crystal from a silicon melt to measure an elevation and a shape of an unmelted polycrystalline silicon island of the silicon melt during a silicon meltdown process, said apparatus including a chamber having an interior in which the silicon melts, said system for measuring an elevation and a shape of an unmelted polycrystalline silicon island, said system comprising:
   a focused bright light source directed into the interior of the chamber for projecting a bright dot onto the silicon island;
   a camera directed into the interior of the chamber for generating a continuous image pattern of a portion of the silicon island including the bright dot;
   a vision system for capturing the image pattern generated by the camera and processing the image pattern; and
   a programmable controller communicating with the vision system and positioned remote from the chamber for determining a location and an elevation of the bright dot and continuously calculating a shape and an elevation of the silicon island therefrom based on the image pattern.

8. The system of claim 7 wherein the light source has an optical output of greater than about 10 mW.

9. The system of claim 8 wherein the light source has a wavelength less than about 600 nm.

10. The system of claim 7 further comprising an optical shield having a wavelength corresponding to that of the light source, the optical shield being installed adjacent the crystal grower for protecting an operator from radiation.

11. The system of claim 7 further comprising a filter for filtering the image pattern of the camera.

12. The system of claim 7 further comprising a scanner attached to the optical shield for scanning the bright dot in one or more dimensions to provide 3D measurements of the silicon island.

13. The system of claim 12 wherein the scanner comprises a piezoelectric controlled mirror.

* * * * *